US010206529B2

(12) United States Patent
Fonseca et al.

(10) Patent No.: US 10,206,529 B2
(45) Date of Patent: *Feb. 19, 2019

(54) MAILBOX AND SYSTEM WITH ILLUMINATED CHARACTERS

(71) Applicants: Efrain Fonseca, Kissimmee, FL (US); Bernice Fonseca, Kissimmee, FL (US)

(72) Inventors: Efrain Fonseca, Kissimmee, FL (US); Bernice Fonseca, Kissimmee, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 15/796,084

(22) Filed: Oct. 27, 2017

(65) Prior Publication Data
US 2018/0103787 A1  Apr. 19, 2018

Related U.S. Application Data

(63) Continuation-in-part of application No. 15/293,125, filed on Oct. 13, 2016, now Pat. No. 9,826,853.

(51) Int. Cl.
| A47G 29/12 | (2006.01) |
| G09F 13/22 | (2006.01) |
| G09F 23/00 | (2006.01) |
| G09F 9/33 | (2006.01) |
| H01L 31/042 | (2014.01) |
| H02S 40/38 | (2014.01) |

(Continued)

(52) U.S. Cl.
CPC .......... *A47G 29/1212* (2013.01); *G09F 7/10* (2013.01); *G09F 9/33* (2013.01); *G09F 13/005* (2013.01); *G09F 13/22* (2013.01); *G09F 15/0037* (2013.01); *G09F 15/0043* (2013.01); *G09F 23/00* (2013.01); *H01L 31/042* (2013.01); *H02S 40/38* (2014.12); *G09F 2013/222* (2013.01); *G09F 2023/0025* (2013.01)

(58) Field of Classification Search
CPC ............ A47G 29/1212; A47G 29/1216; A47G 29/122; A47G 29/30; A47G 2029/1226; H02S 40/38; G09F 9/33; G09F 13/005; G09F 13/22; G09F 23/00; G09F 2013/222; G09F 2013/041; G09F 2023/00257; G09F 2023/0025; G09F 7/10; G09F 15/0037; G09F 15/0043; H01L 31/042
USPC ...................... 232/17, 38, 39; 40/566, 606.06
See application file for complete search history.

(56) References Cited

U.S. PATENT DOCUMENTS

| 5,522,540 A * | 6/1996 | Surman ............... A47G 29/1209 136/291 |
| 6,401,373 B1 * | 6/2002 | Sexton .................... G09F 13/04 40/576 |

(Continued)

*Primary Examiner* — William L Miller
(74) *Attorney, Agent, or Firm* — Jason T. Daniel, Esq.; Daniel Law Offices, P.A.

(57) ABSTRACT

A mailbox system includes a mailbox body for receiving and storing mail items. One or more receiver units are disposed along an outside facing surface of the mailbox body and function to receive at least one address indicator having a plurality of lighted elements along a front facing surface thereof. An internal controller having a power unit is positioned within the mailbox body. The power unit includes at least one battery and at least one solar cell for supplying the necessary electrical information to the receiver unit and the address indicators. Physical markings are disposed along the address indicator and form address information. When activated, the plurality of lighted elements display address information.

17 Claims, 10 Drawing Sheets

(51) Int. Cl.
*G09F 13/00* (2006.01)
*G09F 15/00* (2006.01)
*G09F 7/10* (2006.01)

(56) References Cited

U.S. PATENT DOCUMENTS

| | | | |
|---|---|---|---|
| 6,708,876 B1 * | 3/2004 | Shirah | A47G 29/1209 232/38 |
| 6,964,366 B2 | 11/2005 | Peng et al. | |
| 7,578,085 B1 | 8/2009 | Chao et al. | |
| 8,819,968 B1 * | 9/2014 | Van Beek | G09F 27/007 40/544 |
| 2002/0017045 A1 * | 2/2002 | Weiss | G09F 13/04 40/580 |
| 2003/0053308 A1 * | 3/2003 | Cathel | A47G 29/1209 362/154 |
| 2003/0121191 A1 * | 7/2003 | DeJarnette | G09F 13/04 40/576 |
| 2003/0168506 A1 * | 9/2003 | Katulka | A47G 29/1209 232/38 |
| 2005/0116019 A1 * | 6/2005 | Peng | A47G 29/1209 232/19 |
| 2006/0118609 A1 | 6/2006 | Iannello | |
| 2006/0150453 A1 * | 7/2006 | Martin | G09F 13/22 40/544 |
| 2006/0191988 A1 * | 8/2006 | Laborde | A47G 29/122 232/38 |
| 2008/0005943 A1 * | 1/2008 | Chao | G09F 13/22 40/544 |
| 2008/0257947 A1 | 10/2008 | Guo et al. | |
| 2010/0073919 A1 * | 3/2010 | Sharpe | A47G 29/1209 362/154 |
| 2015/0001283 A1 * | 1/2015 | Morris | A47G 29/122 232/17 |
| 2015/0108209 A1 * | 4/2015 | Cho | A47G 29/1212 232/34 |

* cited by examiner

MAILBOX AND SYSTEM WITH ILLUMINATED CHARACTERS

CROSS-REFERENCE TO RELATED APPLICATIONS

This application claims the benefit of U.S. application Ser. No. 15/293,125 filed on Oct. 13, 2016, the contents of which are incorporated herein by reference.

TECHNICAL FIELD

The present invention relates generally to mailboxes, and more particularly to a system for providing and displaying illuminated characters.

BACKGROUND

The statements in this section merely provide background information related to the present disclosure and may not constitute prior art.

Mailboxes for single family homes are typically freestanding devices having an elongated pedestal upon which a container is mounted for receiving and storing mail. Each of these mailboxes are typically adorned with painted numbers which represent the address of the home to which it belongs. Such a feature is advantageous, as it allows guests and visitors to easily identify the correct property to which they are traveling.

Although these numbers work well in daylight to provide the address of the home, they are often difficult to see at night. Moreover, it is not uncommon for the address information to dramatically fade over time, thus making it virtually impossible to make out the address listed on the mailbox at night.

Although described with respect to mailbox addresses, the same issues are often found with regard to other types of signs such as billboards, pole-mounted street signs, and/or overhead street signs, for example.

The present invention, directed to a mailbox with illuminated address information, and a system for providing illuminated characters differs from the conventional art in a number of aspects. The manner by which will become more apparent in the description which follows, particularly when read in conjunction with the accompanying drawings.

SUMMARY OF THE INVENTION

The present invention is directed to a mailbox system. One embodiment of the present invention can include a mailbox body that is capable of receiving and storing mail items. The mailbox body can include one or more receiver units along an outside facing surface. Each of the one or more receiver units can act to receive at least one address indicator, having a plurality of lighted elements along a front facing surface thereof.

In another embodiment, the mailbox system can also include an internal controller having a power unit. The power unit can include at least one battery and at least one solar cell for supplying the necessary electrical information to the receiver unit and the address indicators. When activated, the plurality of lighted elements can display any type of address information that is selected by a user.

In yet another embodiment, the mailbox system can also include physical markings that encompass the plurality of lighted elements. The physical markings can display the same address information.

This summary is provided merely to introduce certain concepts and not to identify key or essential features of the claimed subject matter.

BRIEF DESCRIPTION OF THE DRAWINGS

Presently preferred embodiments are shown in the drawings. It should be appreciated, however, that the invention is not limited to the precise arrangements and instrumentalities shown.

DETAILED DESCRIPTION OF THE INVENTION

Figure 1:
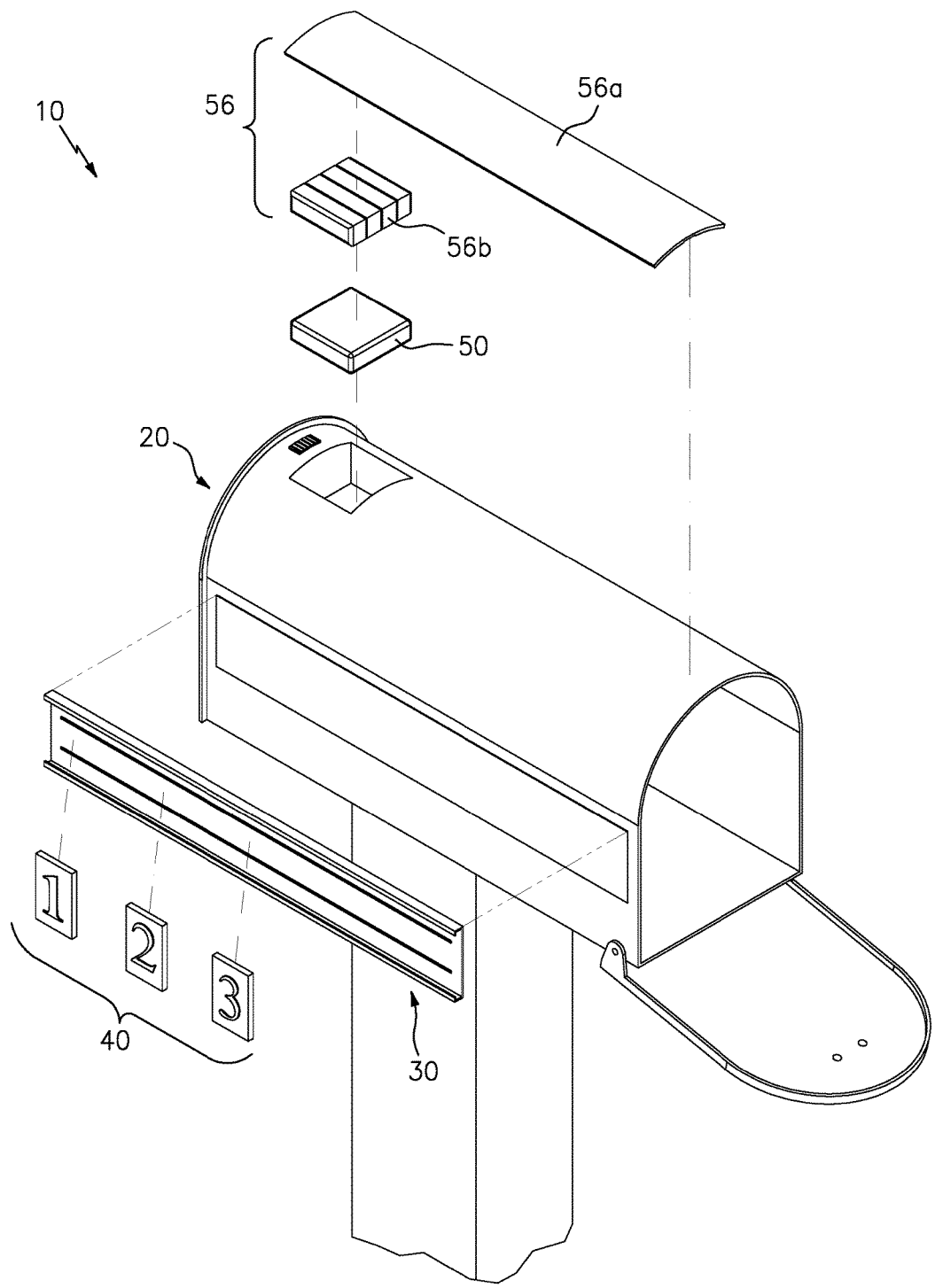
FIG. 1 is an exploded parts view of the mailbox system that is useful for understanding the inventive concepts disclosed herein.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

As described throughout this document, the term "complementary shape," and "complementary dimension," shall be used to describe a shape and/or size of a component that is identical to, or substantially identical to the shape and/or size of another identified component.

As described herein, the term "removably secured" and derivatives thereof shall be used to describe a situation wherein two or more objects are joined together in a non-permanent manner so as to allow the same objects to be repeatedly joined and separated. This can be accomplished through the use of the below described upper and lower channels, and/or any number of commercially available connectors such as opposing strips of hook and loop material (i.e. Velcro®), magnetic elements, and compression fittings such as hooks, snaps and buttons, for example. Moreover, the term "permanently secured" shall be used to describe a situation wherein two or more objects are joined together in a manner so as to prevent the same objects from being separated. Several nonlimiting examples include various adhesives such as glue or resin, welds and/or hardware such as nuts and bolts, for example.

FIGS. 1-6 illustrate various embodiments of a mailbox with illuminated address information 10 that are useful for understanding the inventive concepts disclosed herein. In each of the drawings, identical reference numerals are used for like elements of the invention or elements of like function. For the sake of clarity, only those reference numerals are shown in the individual figures which are necessary for the description of the respective figure. For purposes of this description, the terms "upper," "bottom," "right," "left," "front," "vertical," "horizontal," and derivatives thereof shall relate to the invention as oriented in FIG. 1.

FIG. 1 is an exploded parts view of the system components. As shown, the mailbox system 10 can include, essentially, a mailbox body 20, one or more receiver units 30, a plurality of illuminated characters 40, an internal controller 50 and a power unit 56.

Figure 2:
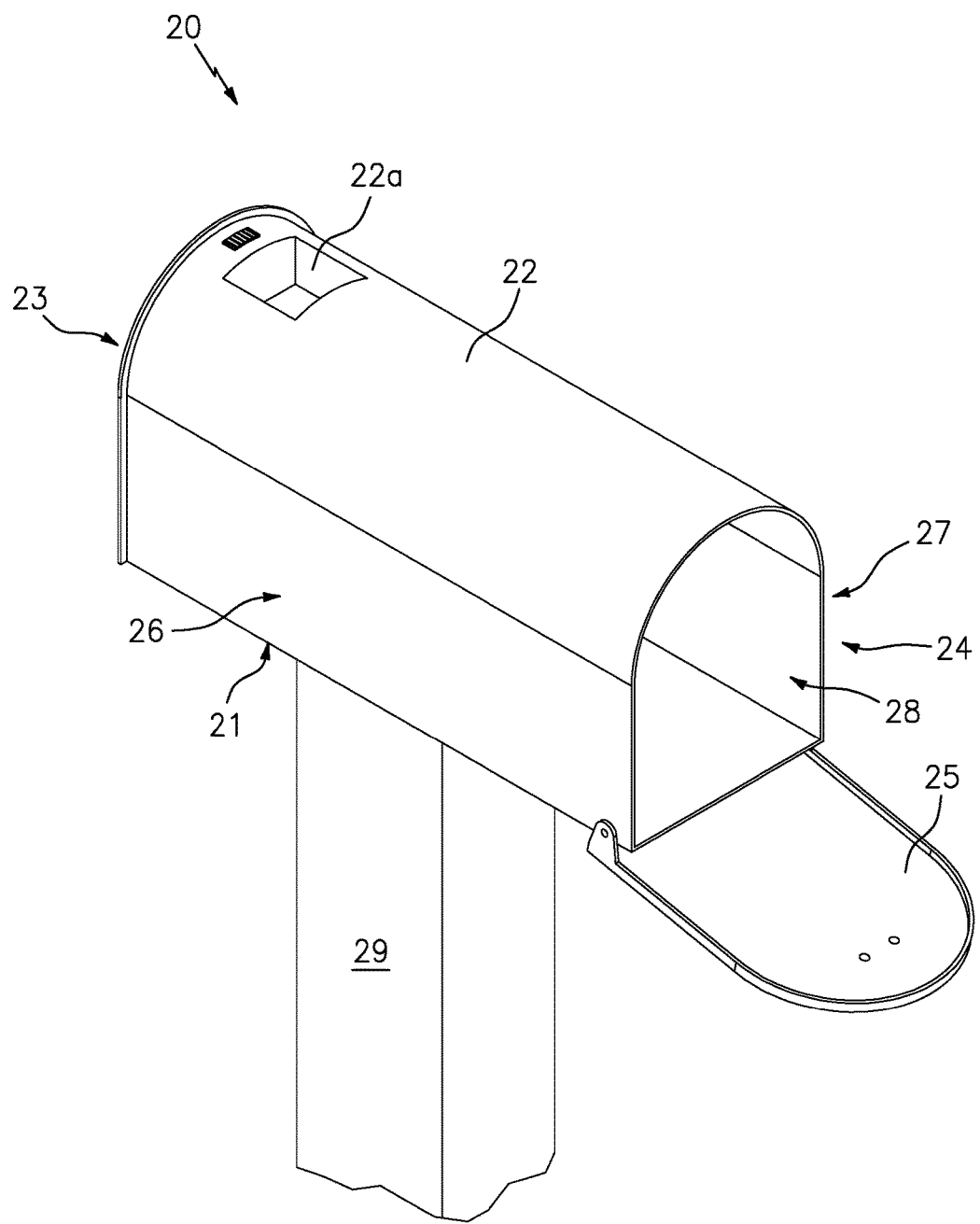
FIG. 2 is a perspective view of the mailbox body of the mailbox system, in accordance with one embodiment of the invention.

As shown in FIG. 2, the mailbox body 20 can include an elongated member having a bottom end 21, a top end 22, a capped back end 23, an open front end 24, a door 25, and a pair of opposing sides 26 and 27 that define a generally hollow interior space 28. The mailbox can be constructed from any number of different materials that are suitable for prolonged exposure to adverse weather conditions such as plastic and metal, for example, and can include an unlimited number of different shapes and sizes.

As shown, the mailbox can be mounted onto a pedestal 29 which may also include a horizontal arm (not illustrated). In the preferred embodiment, a recessed area 22a can be formed along the top end of the mailbox 22, so as to receive the below described controller 50.

Figure 3:
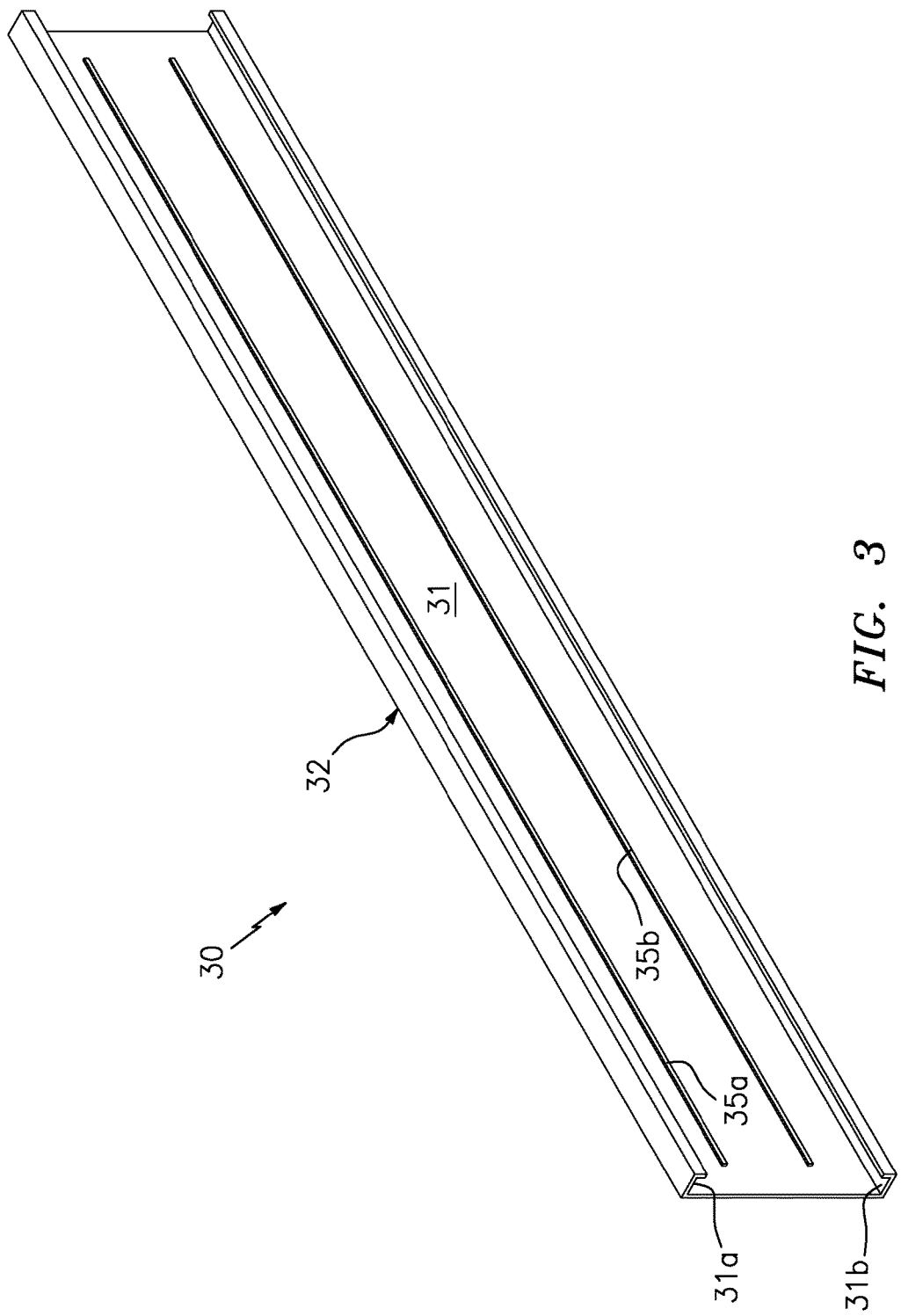
FIG. 3 is a perspective view of the address receiver of the mailbox system, in accordance with one embodiment of the invention.
Figure 4:
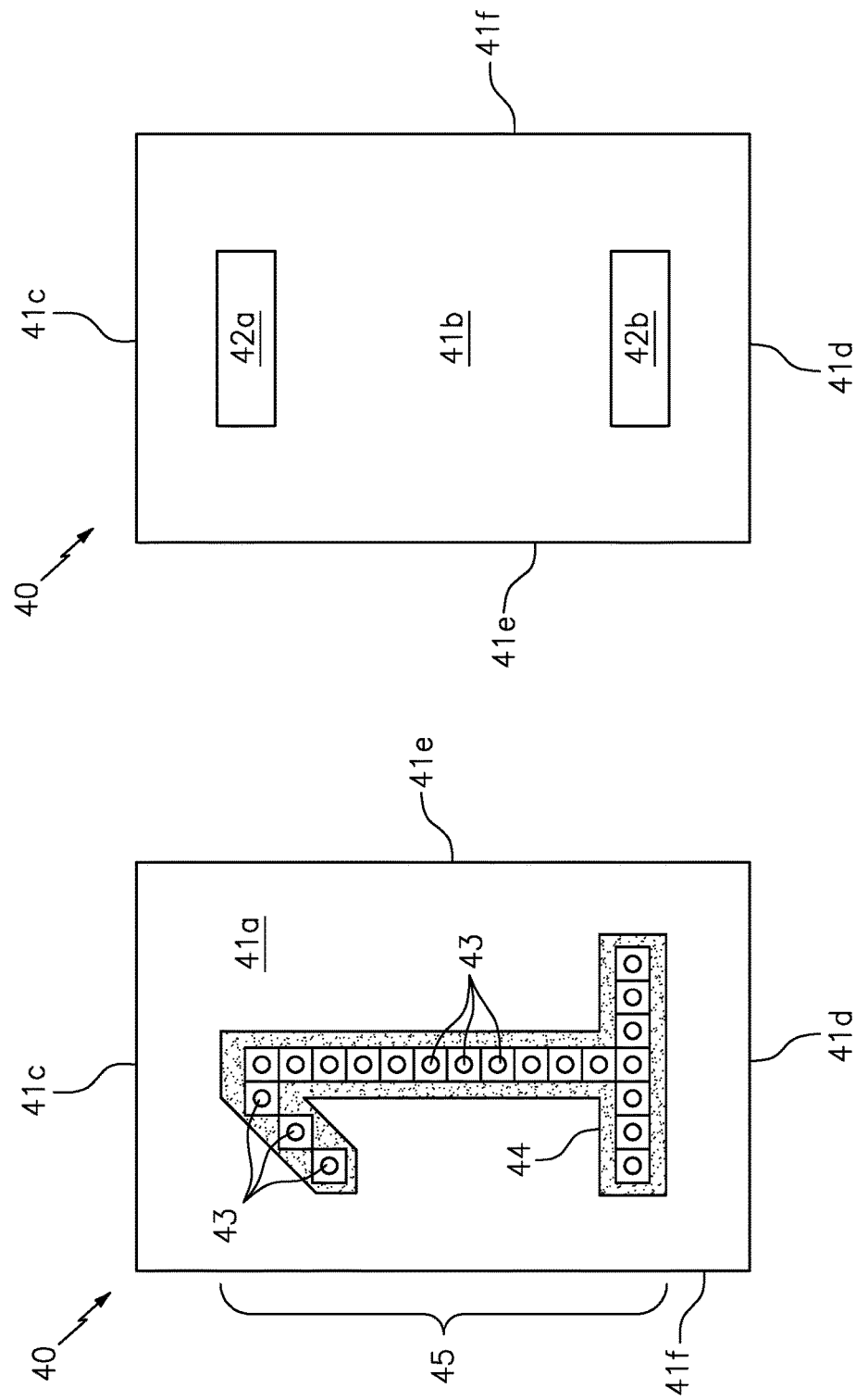
FIG. 4A is a front side view of an address indicator of the mailbox system, in accordance with one embodiment of the invention.
FIG. 4B is a back side view of an address indicator of the mailbox system, in accordance with one embodiment of the invention.

FIG. 3 illustrates one embodiment of a receiver unit 30 that includes an elongated main body having a front facing surface 31, and a rear facing surface 32. In the preferred embodiment, a pair of elongated, generally U-shaped channels 31a and 31b can extend along the top and bottom ends of the front facing surface (i.e., upper and lower channels). The channels can function to receive any number of illuminated characters 40 which can be slid along the length of the receiver unit body (e.g., slidingly receive).

As shown, the receiver unit 30 can also include a pair of electrically conductive supply contacts 35a and 35b which can run along the length of the front surface 31. Each of the contacts can be in communication with the battery 56b of the below described power unit, so as to receive and provide positive and negative direct current (dc) electricity, respectively, to the complementary contacts of the address indicators.

As described herein, the receiver unit can preferably be constructed from a durable and non-electrically conductive material such as plastic, for example, and can include any number of different shapes and sizes. The rear facing surface 32 of the receiver unit can be connected to the mailbox 20 utilizing any number of different connectors such as various adhesives and/or hardware such as nuts and bolts, for example.

FIGS. 4A and 4B illustrate one exemplary embodiment of an illuminated character 40 that includes a main body having a front surface 41a, a rear surface 41b, a top end 41c, a bottom end 41d, and a pair of opposing sides 41e and 41f. As described herein, the terms "illuminated character" and "address indicator" are used interchangeably and can include any number of different shapes and sizes, and can be constructed from any number of different materials, such as plastic, for example.

In one embodiment, a pair of electrically conductive receiver contacts 42a and 42b can be positioned along the rear surface 41b, and can be positioned so as to make contact with the supply contacts 35a and 35b, respectively, when the illuminated character 40 is secured along the receiver unit 30.

As shown, a plurality of lighted elements 43 and/or physical markings 44 can be arranged along each character 40. In the preferred embodiment, each of the lighting elements can include or comprise one or more light emitting diodes (LED), for example, that can be connected to the receiver contacts 42a and 42b, so as to receive electrical power therefrom. Each of the light emitting diodes can function to generate light in any number of different colors and intensities Likewise, the physical marking can include various colors which can be imprinted onto the main body so as to be clearly visible when the lighting elements are not illuminated. Of course, the inventive concepts disclosed herein are not limited to the use of LED's, as any number of other known elements capable of producing light can also be utilized.

As described herein, each of the illuminated characters can include, comprise or consist of any number and type of distinctive elements such as various letters, numbers, words, markings, shapes, symbols, logos, designs, and/or patterns, for example forming the desired display information 45, such as a name, or number, for example. In the preferred embodiment, the illuminated characters can be arranged to display the physical address of the home or building to which the mailbox is located; however, other embodiments are contemplated wherein the illuminated characters can convey different information for different purposes.

In the preferred embodiment, each of the illuminated characters 40 can include a height (i.e., distance between the top and bottom ends) that is complementary to the distance between the upper and lower channels 31a and 31b, respectively of the receiver unit 30. Such a feature allows any number of individual address indicators to be slid along the main body 31 and held in place by the channels. When so positioned, receiver contacts 42a and 42b will be in communication with supply contacts 35a and 35b, respectively, so as to provide power to illuminate the lighted elements 43.

Figure 5:
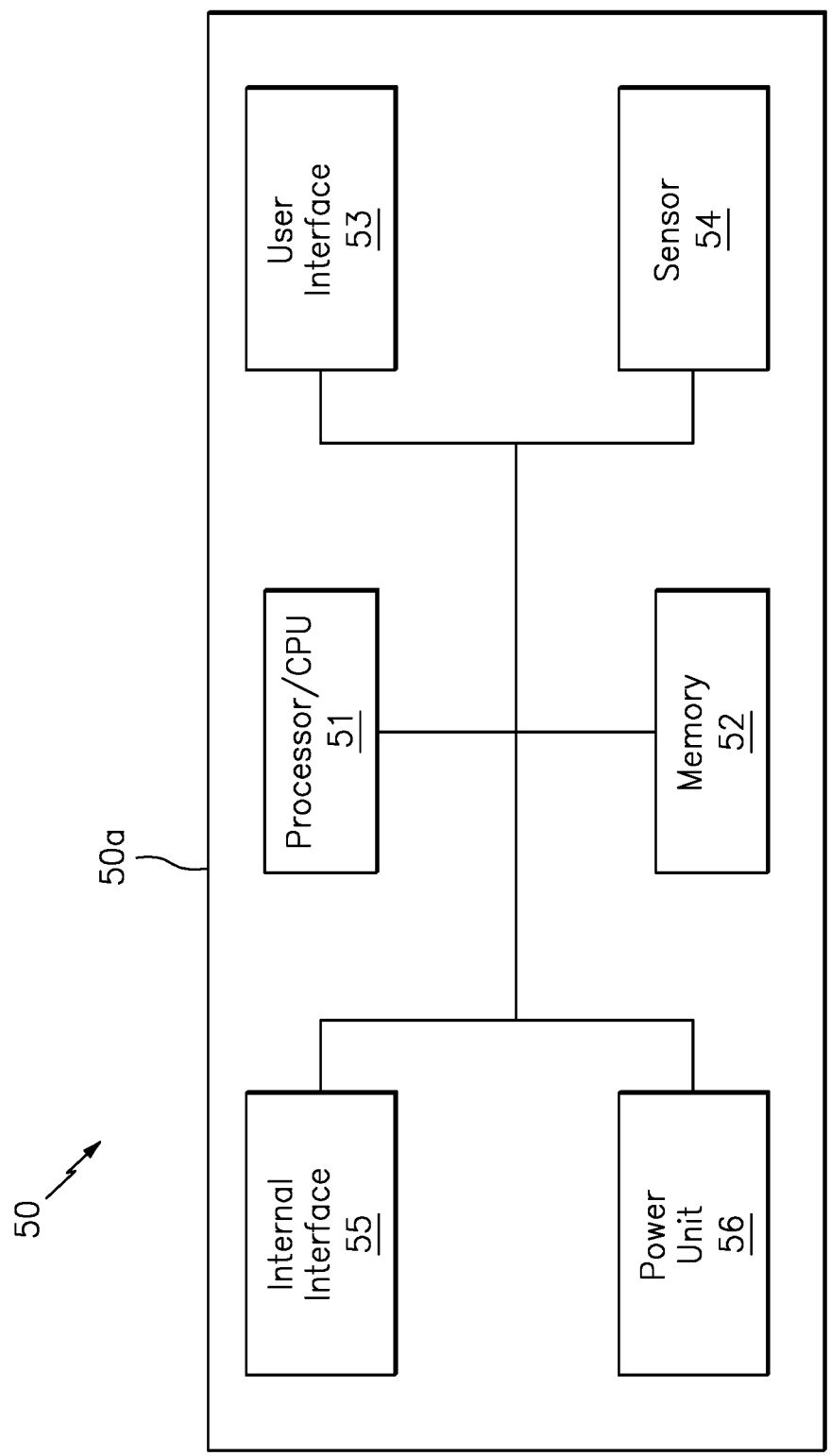
FIG. 5 is a simplified block diagram of the internal controller of the mailbox system, in accordance with one embodiment of the invention.

FIG. 5 is an exemplary block diagram of an internal system controller 50 which may be used with the system 10. As shown, the internal controller 50 can include any number of different components which can function to perform the methodology described herein. In various embodiments, the system controller can include an outer shell/body 50a having a processor 51 that is conventionally connected to an internal memory 52, a user interface 53, a sensor 54, an internal component interface unit 55, and/or a power unit 56.

Although illustrated as separate elements, those of skill in the art will recognize that one or more system components may comprise, or include one or more printed circuit boards (PCB) containing any number of integrated circuit or circuits for completing the activities described herein. The CPU may be one or more integrated circuits having firmware for causing the circuitry to complete the activities described herein. Of course, any number of other analog and/or digital components capable of performing the below described functionality can be provided in place of, or in conjunction with the below described controller elements.

The main body 50a can include any number of different shapes and sizes, and can be constructed from any number of different materials suitable for encompassing each of the controller elements. In one preferred embodiment, the main body 50a can be constructed from lightweight injection molded plastic having a plurality of internal connectors (not shown) for securely housing each of the device elements. The controller body can be secured anywhere within or along the mailbox body, and preferably within the recessed area 22a, for example.

The processor/CPU 51 can act to execute program code stored in the memory 52 in order to allow the device to perform the functionality described herein.

Memory 52 can act to store operating instructions in the form of program code for the processor 51 to execute. As such, memory 52 can include one or more physical memory devices such as, for example, local memory and/or one or more bulk storage devices which can provide storage of at least some program code in order to operate the system as described herein.

The user interface 53 can function to accept user inputs to the system controller. In various embodiments, the user interface can include or control one or more buttons/switches 53a, that are connected to the processor 51 so as to activate various programmatic functions, such as selectively activating the lighting elements of the illuminated characters 40 and/or transitioning the system between an ON and OFF operating state, for example.

In one embodiment, the user interface 53 can also function to receive commands remotely, through the use of a wired or wireless interface. As such, the user interface can also include any number of different wired or wireless network adapters, for communicating over a network such as a WAN, LAN, telecommunication network and/or the internet, for example. Such a feature can allow a user to remotely transition the system between the ON and OFF operating state.

The system can also include one or more sensors 54, such as a commercially available dusk to dawn photo sensor, for example. Such a sensor can be used to allow the lighted elements to remain illuminated at night, and to remain in the OFF operating state during daylight hours, thus preserving battery power and prolonging the lifespan of the system.

The internal component interface unit 55 can function to provide a communicative link between the processor 51 and various other device components such as the receiver unit 30, the address indicator 40, and/or the sensor 54, for example. In this regard, the component interface unit can include any number of different components such as one or more PIC microcontrollers, internal bus, USB connections and other such hardware capable of providing a direct link between the various components. Of course any other means for providing the two way communication between the system components can also be utilized herein.

Figure 6:
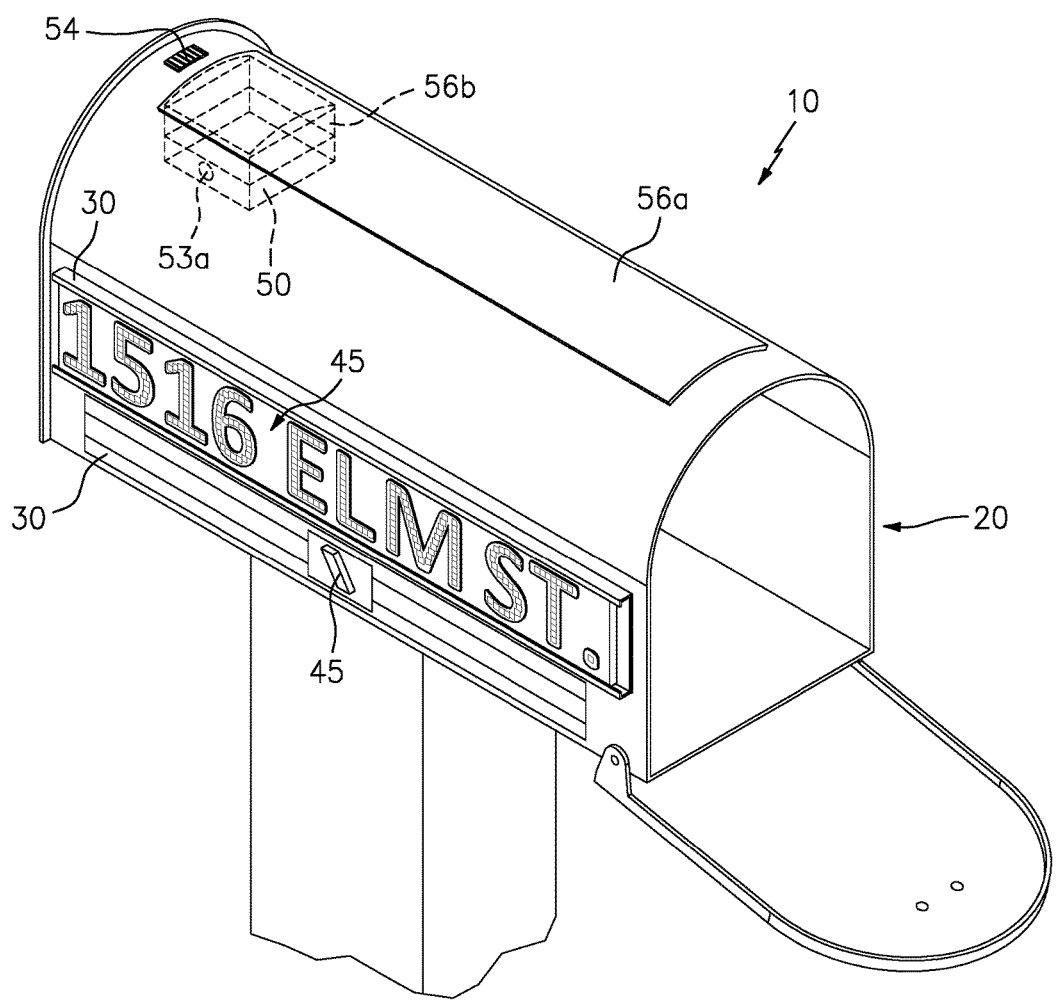
FIG. 6 is a perspective view of the mailbox system in operation, in accordance with one embodiment of the invention.

The power unit 56 can function to provide the necessary power requirements to the system components. In the preferred embodiment, the power unit can include one or more photovoltaic cells (i.e., solar cell) 56a that are connected to one or more batteries 56b. As shown in FIG. 6, the battery 56b and controller 50 can preferably be positioned within the recessed area of the mailbox, and the solar cell 56a can be positioned above the same. As such, the location of the solar cell (along with the body of the mailbox body 20) can function to shield the battery and controller against the damaging effects caused by moisture from adverse weather conditions such as rain and snow, for example. Such a location advantageously increases the lifespan of the system components, and allows a user to easily access the battery and/or control unit for easy replacement of the same without having to replace the entire mailbox body. Of course, other embodiments are contemplated wherein the power unit 56 can include, comprise or consist of an alternating current electrical power transformer and cord 56c capable of allowing the system to be powered from an electrical grid and providing low voltage power to the device components.

In operation, a user can position any number of discrete illuminated characters 40 along each of the receiver units 30 to create any desirable address information. Once the system 10 is positioned outdoors, the mailbox can function in the expected manner to receive and store mail Likewise, the solar cell 56b can convert sunlight into electrical energy which can be stored by the battery 56b. Upon receipt of a command from the user interface 53a and/or the daylight sensor 54, the system can selectively provide power to the receiver unit, thereby activating each of the lighted elements 43 to illuminate the address information, as described above. Finally, the system can deactivate the lighted elements upon another command from the user interface 53a and/or the daylight sensor 54 indicating the presence of sunlight.

Although described above as being incorporated into the construction of a mailbox, the inventive concepts disclosed herein are not so limiting. To this end, many different applications are also contemplated wherein the above noted features can be produced as a stand-alone system for use with other structures and for other purposes.

Figure 7:
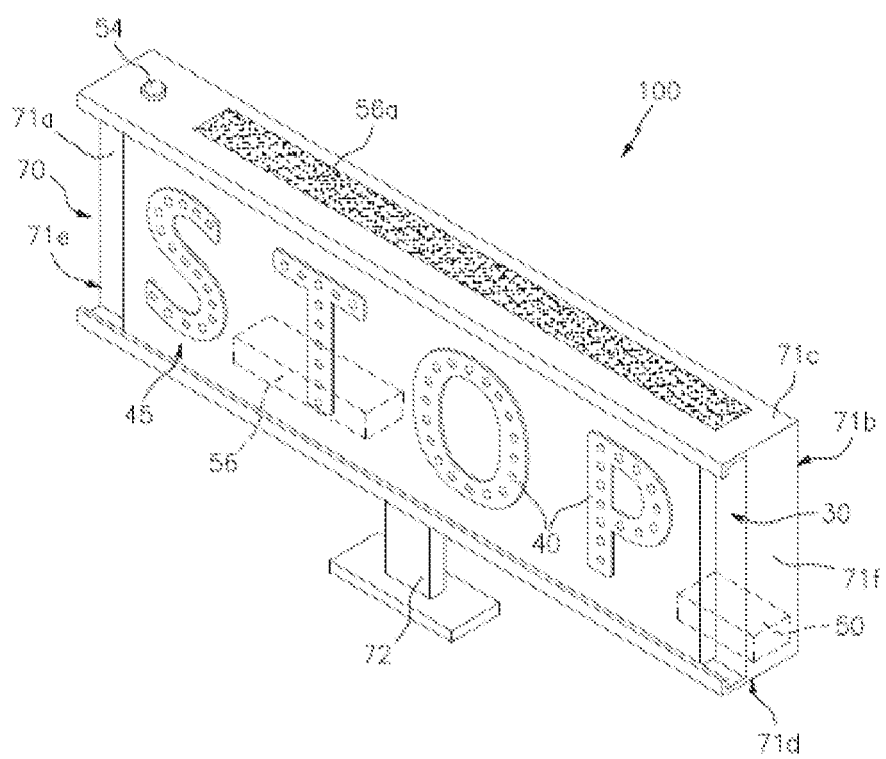
FIG. 7 is a side view of a stand-alone illuminated character system, in accordance with another embodiment of the invention.

FIG. 7 illustrates one embodiment of a stand-alone illuminated character system 100. As shown, the system can include a main body 70 having a mounting unit 72, and the above described receiver unit 30, illuminated characters 40, and system controller 50.

As described herein, the main body 70 can include any number of different shapes and sizes, and can be constructed from any number of different materials. In one embodiment, the main body can include the illustrated rectangular shape having a front surface 71a, back surface 71b, top end 71c, bottom end 71d, and opposing side surfaces 71e and 71f that define an interior space.

The mounting unit 72 can function to secure the main body onto an external object in either a permanent or non-permanent manner. As such, the mounting unit can be physically coupled to any portion of the main body, and can include any number of different connectors such as various brackets, adapters, clamps, couplings, and/or fasteners, for example.

As shown, the controller 50 and power unit 56 can be positioned within the interior space of the main body 70, and one or more of the receiver units 30 can be positioned along the main body. To this end, a plurality of receiver units 30 can be positioned onto one or more surfaces 71a-71f of a single main body. Each of the receiver units can include a plurality of illuminated characters 40 which can work together to display any type of information 45, such as a name, or number, for example.

Figure 8:
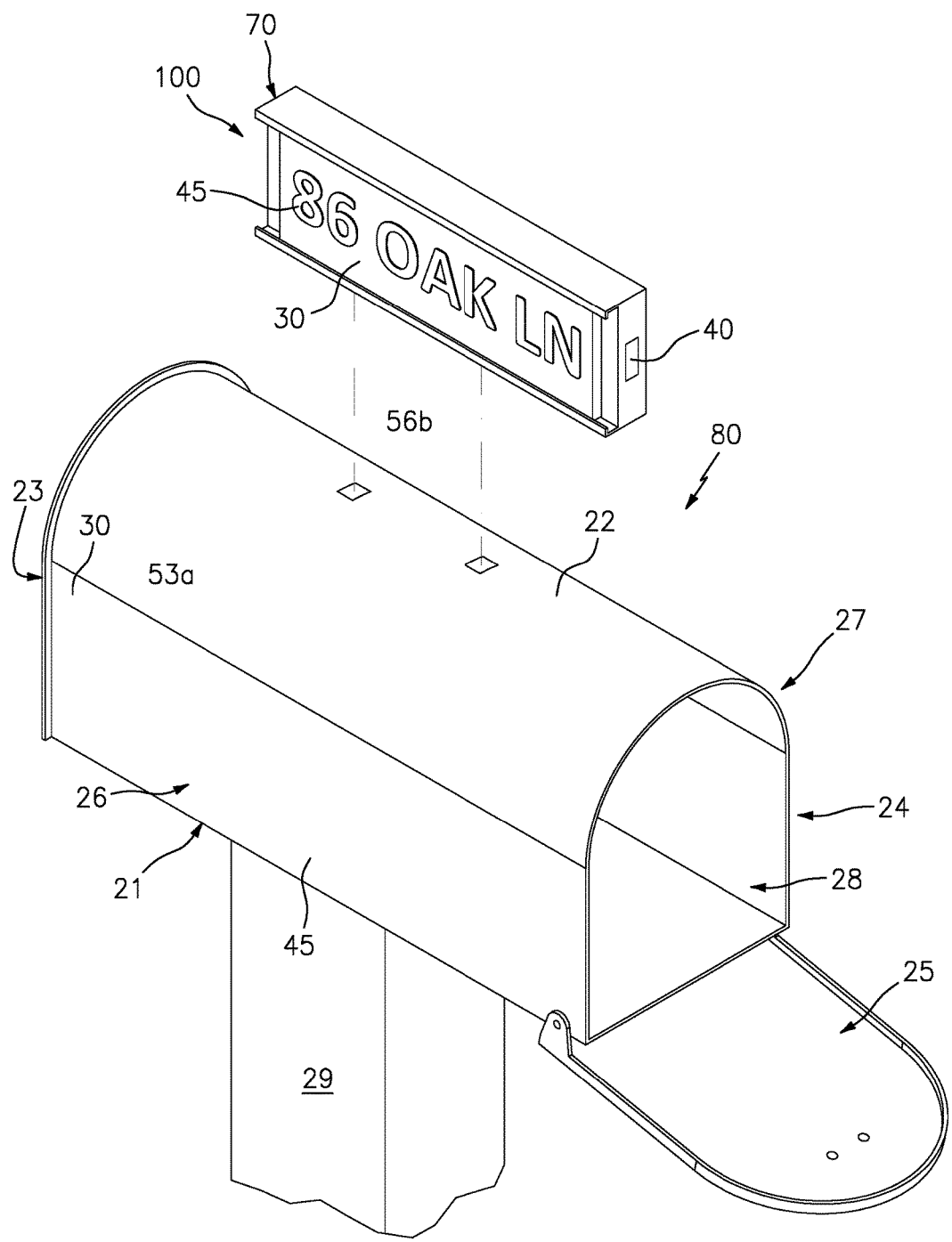
FIGS. 8-10 illustrate various embodiments of the stand-alone illuminated character system in operation, in accordance with another embodiment of the invention.
Figure 9:
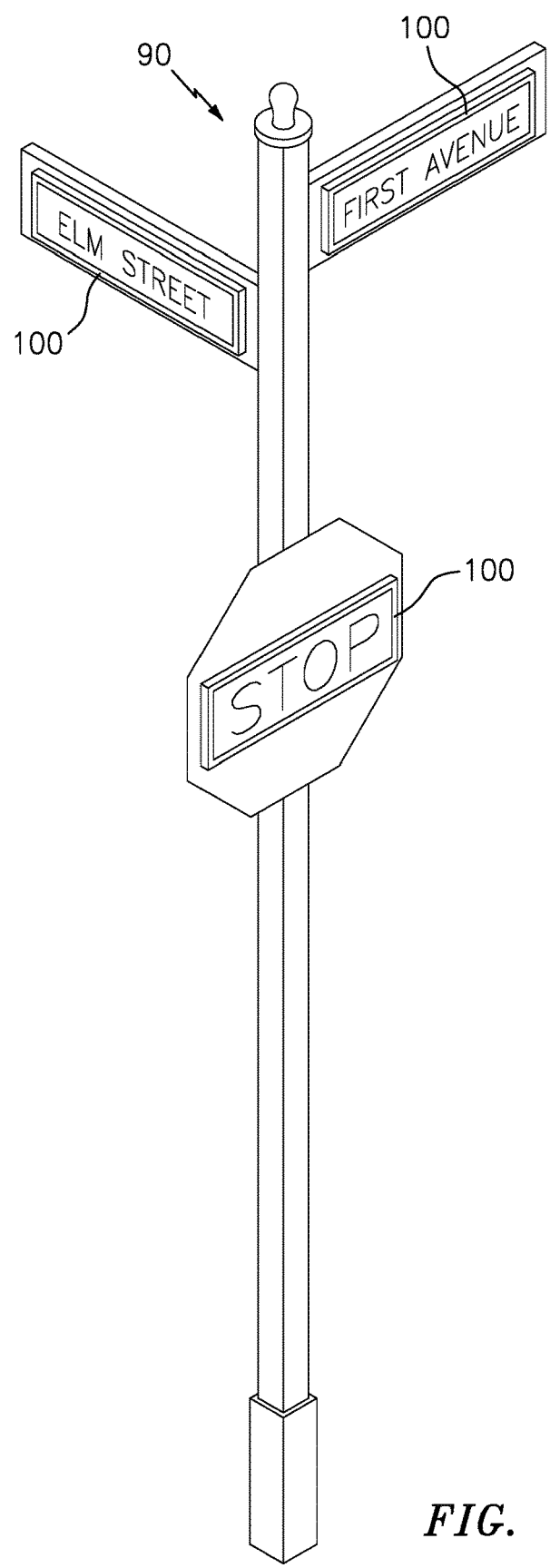
Figure 10:
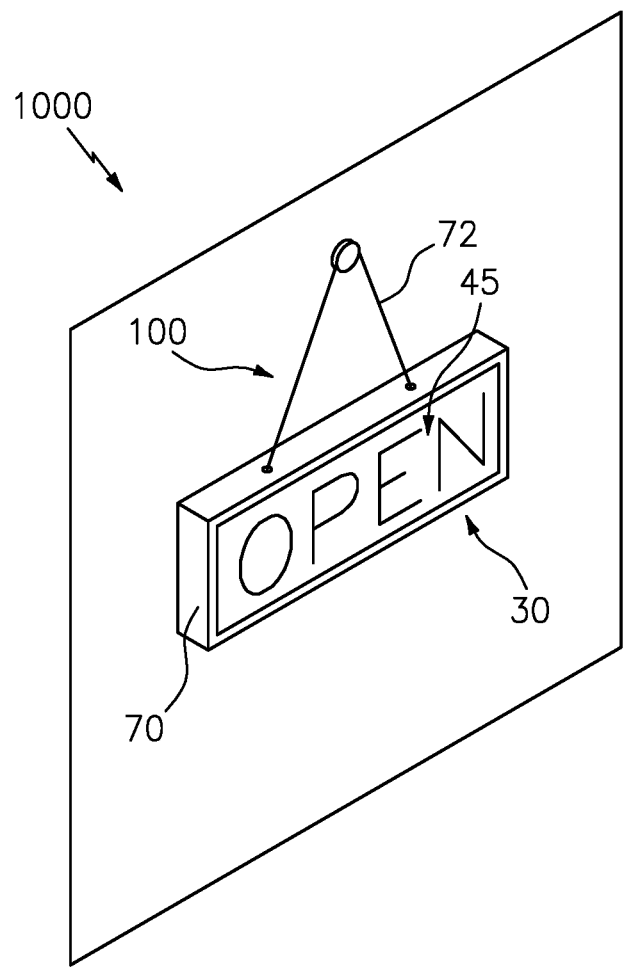

The system 100 can function in a virtually identical manner as described above with regard to the mailbox system 10, and can further allow the above described functionality to be utilized in different industries and/or for different purposes. To this end, FIGS. 8-10 illustrate various nonlimiting embodiments of potential uses and additional components for the system 100 such as a conventional mailbox 80, a pole-mounted street sign 90, and an office window 1000, for example.

As described herein, one or more elements of the mailbox with illuminated address information 10, and the illuminated character system 100 can be secured together utilizing any number of known attachment means such as, for example, screws, glue, compression fittings and welds, among others. Moreover, although the above embodiments have been described as including separate individual elements, the inventive concepts disclosed herein are not so limiting. To this end, one of skill in the art will recognize that one or more individually identified elements may be formed together as one or more continuous elements, either through manufacturing processes, such as welding, casting, or molding, or through the use of a singular piece of material milled or machined with the aforementioned components forming identifiable sections thereof.

As to a further description of the manner and use of the present invention, the same should be apparent from the above description. Accordingly, no further discussion relating to the manner of usage and operation will be provided.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Likewise, the terms "consisting" shall be used to describe only those components identified. In each instance where a device comprises certain elements, it will inherently consist of each of those identified elements as well.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An illuminated character system, comprising:
a main body having a plurality of sides defining an interior space and a recessed area located along one of the plurality of sides;
a receiver unit that is positioned along one of the plurality of sides of the main body;
at least one illuminated character that is removably positioned within the receiver unit, said at least one illuminated character including a plurality of lighted elements along a front facing surface thereof;
an internal controller having a power unit for providing power to the receiver unit and the at least one illuminated character; and
a mounting unit that is configured to secure the main body onto an external object,
wherein the power unit includes at least one solar power cell, and
wherein the internal controller is disposed within the recessed area and the at least one solar power cell covers both the recessed area and the controller.

2. The system of claim 1, wherein the receiver unit further includes a pair of elongated channels that are configured to slidingly receive each of the at least one illuminated character.

3. The system of claim 1, wherein the plurality of lighted elements of each of the at least one illuminated character comprise light emitting diodes.

4. The system of claim 3, wherein the plurality of lighted elements of each of the at least one illuminated character forms a discrete piece of display information.

5. The system of claim 4, wherein the display information includes, at least one of a letter, a number, a word and a symbol.

6. The system of claim 5, further comprising:
a physical marking that encompasses each discrete piece of display information.

7. The system of claim 1, further comprising:
a daylight sensor that is in communication with the internal controller, said sensor functioning to selectively activate the plurality of lighted elements.

8. The system of claim 1, further comprising:
a user interface that is configured to receive user instructions, said user interface being in communication with the internal controller and functioning to selectively activate the plurality of lighted elements.

9. The system of claim 8, wherein the user interface comprises:
at least one actuator that is physically positioned along the main body.

10. The system of claim 8, wherein the user interface comprises:
a wireless adapter that is configured to receive user instructions over a network.

11. The system of claim 1, wherein the receiver unit further includes a pair of horizontal channels that are configured to slidingly receive each of the at least one illuminated character.

12. The system of claim 1, wherein the receiver unit further includes a pair of elongated channels that are configured to slidingly receive the at least one illuminated character and another illuminated character.

13. An illuminated character system, comprising:
a main body having a plurality of sides defining an interior space;
a plurality of illuminated characters each having a plurality of lighted elements along a front facing surface;
a receiver unit that is positioned along one of the plurality of sides of the main body, said receiver unit including a pair of channels that are disposed along a major axis of the main body and is configured to slidingly receive each of the plurality of illuminated characters linearly along the major axis of the main body;
an internal controller having a power unit for providing power to the receiver unit and the plurality of illuminated characters;
a pair of electrically conductive supply contacts that are disposed longitudinally along the receiver at a location between the pair of channels; and each of the plurality of illuminated characters includes a pair of electrically conductive receiver contacts that are disposed along a rear facing surface, wherein the pair of supply contacts are configured to supply power to the receiver contacts of each of the plurality of illuminated characters located anywhere along the receiver unit.

14. The system of claim 13, further comprising:

a daylight sensor that is in communication with the internal controller, said sensor functioning to selectively activate the plurality of lighted elements.

15. The system of claim 13, wherein the plurality of lighted elements of each of the plurality of illuminated characters comprise light emitting diodes.

16. The system of claim 13, wherein the plurality of lighted elements of each of the at least one illuminated character forms a discrete piece of display information.

17. The system of claim 16, wherein the display information includes, at least one of a letter, a number, a word and a symbol.

* * * * *